United States Patent [19]
Chen et al.

[11] Patent Number: 5,462,898
[45] Date of Patent: Oct. 31, 1995

[54] METHODS FOR PASSIVATING SILICON DEVICES AT LOW TEMPERATURE TO ACHIEVE LOW INTERFACE STATE DENSITY AND LOW RECOMBINATION VELOCITY WHILE PRESERVING CARRIER LIFETIME

[75] Inventors: Zhizhang Chen, Duluth; Ajeet Rohatgi, Marietta, both of Ga.

[73] Assignee: Georgia Tech Research Corporation, Atlanta, Ga.

[21] Appl. No.: 249,121

[22] Filed: May 25, 1994

[51] Int. Cl.$^6$ .................................... H01L 21/02
[52] U.S. Cl. .................. 437/235; 437/238; 437/243; 437/247; 437/941
[58] Field of Search ................ 437/247, 235, 437/238, 937, 939, 941, 10–13

[56] References Cited

U.S. PATENT DOCUMENTS

| | | | |
|---|---|---|---|
| 4,743,569 | 5/1988 | Plumton et al. | 437/247 |
| 4,962,065 | 10/1990 | Brown et al. | 437/242 |
| 5,068,124 | 11/1991 | Batey et al. | 427/39 |
| 5,254,480 | 10/1993 | Tran | 437/2 |

OTHER PUBLICATIONS

Chen et al., Plasma–enhanced Chemical–vapor–deposited oxide for low surface recombination velocity and high effective life time in silicon. J. Appl. Phys. vol. 74, No. 4, 15 Aug. 1993.

Wilson et al. Rapid Thermal Processing of Electronic Materials Symposium pp. 89–94 Apr. 21–23, 1987, Material Research Society Symposium Processings vol. 92, 1987.

Wolf et al. Silicon Processing for the VLSI Era vol. 1—Process technology, pp. 44–45, 171–173, 194, 220–223. 1986, Lattice Press.

Yasuda, T. et al., "Low–temperature preparation of $SiO_2$/Si(100) interfaces using a two–step remote plasma–assisted oxidation–deposition process," Appl. Phys. Lett. 60 (4), 27 Jan. 1992, pp. 434–435.

Pang, S. K. et al., "Record high recombination lifetime in oxidized magnetic Czochralski silicon," Appl. Phys. Lett. 59 (2), 8 Jul. 1991, pp. 195–197.

Girisch, R. et al., "Determination of Si–$SiO_2$ Interface Recombination Parameters Using a Gate–Controlled Point–Junction Diode Under Illumination," IEEE Transactions on Electron Devices, vol. 35, No. 2, Feb. 1988, pp. 203–222.

Ahn, J. et al., "High–Quality MOSFET's with Ultrathin LPCVD Gate $SiO_2$," IEEE Electron Device Letters, vol. 13, N. 4, Apr. 1992, pp. 186–188.

Primary Examiner—Olik Chaudhuri
Assistant Examiner—H. Jey Tsai
Attorney, Agent, or Firm—Hopkins & Thomas; Scott A. Horstemeyer

[57] ABSTRACT

A new process has been developed to achieve a very low $SiO_x$/Si interface state density $D_{it}$, low recombination velocity S (<2 cm/s), and high effective carrier lifetime $T_{eff}$ (>5 ms) for oxides deposited on silicon substrates at low temperature. The technique involves direct plasma-enhanced chemical vapor deposition (PECVD), with appropriate growth conditions, followed by a photo-assisted rapid thermal annealing (RTA) process. Approximately 500-Å-thick $SiO_x$ layers are deposited on Si by PECVD at 250° C. with 0.02 W/cm$^{-2}$ rf power, then covered with SiN or an evaporated thin aluminum layer, and subjected to a photo-assisted anneal in forming gas ambient at 350° C., resulting in an interface state density $D_{it}$ in the range of about $1–4\times10^{10}$ cm$^{-2}$ eV$^{-1}$, which sets a record for the lowest interface state density $D_{it}$ for PECVD oxides fabricated to date. Detailed analysis shows that the PECVD deposition conditions, photo-assisted anneal, forming gas ambient, and the presence of an aluminum layer on top of the oxides during the anneal, all contributed to this low value of interface state density $D_{it}$. Detailed metal-oxide semiconductor analysis and model calculations show that such a low recombination velocity S is the result of moderately high positive oxide charge ($5\times10^{11}$–$1\times10^{12}$ cm$^{-2}$) and relatively low midgap interface state density ($1\times10^{10}$–$4\times10^{10}$ cm$^{-2}$eV$^{-1}$). Photo-assisted anneal was found to be superior to furnace annealing, and a forming gas ambient was better than a nitrogen ambient for achieving a very low surface recombination velocity S.

28 Claims, 6 Drawing Sheets

METHODS FOR PASSIVATING SILICON DEVICES AT LOW TEMPERATURE TO ACHIEVE LOW INTERFACE STATE DENSITY AND LOW RECOMBINATION VELOCITY WHILE PRESERVING CARRIER LIFETIME

The U.S. Government has a paid-up license in the invention and the right in limited circumstances to require the patent owner to license others on reasonable terms as provided by the terms of Contract Nos. E21–H21 and E21–H31 awarded by the U.S. Department of Energy.

FIELD OF THE INVENTION

The present invention relates generally to fabrication and passivation of silicon devices, and more particularly, to a method for passivating a surface of silicon at low temperature to achieve both low interface state density $D_{it}$ and low surface recombination velocity S at the surface, while preserving effective carrier lifetime $T_{\mathit{eff}}$, and to a method for passivating surface and bulk defects in silicon at low temperature to achieve both low surface recombination velocity and high minority carrier lifetime within the internal region of the silicon.

BACKGROUND OF THE INVENTION

Material defects, such as dangling bonds, can reside on the surface or within silicon material. These defects can adversely affect operation of a silicon device, such as a transistor or solar cell, because electron-hole pairs recombine with the defects and are essentially lost. Accordingly, silicon surfaces and bodies are often passivated in order to tie up the defects. In this document, "passivation" means the process of tying up, eliminating, or otherwise rendering inoperative as to current flow, defects in a material.

Several different indicia are used in the industry for indicating the degree to which a surface or body is characterized by defects. "Interface state density," or "$D_{it}$," is sometimes utilized by those skilled in the art and is essentially a measure of the number of defects per unit of area. Another variable used in the industry is the "recombination velocity," or "S,", which is a measure of the rate at which electron-hole pairs migrate toward the defects. The recombination velocity S is mathematically proportional to the interface state density $D_{it}$. In other words, when the recombination velocity S is low, then the interface state density $D_{it}$ is low, and vice versa. Furthermore, the lower the interface state density $D_{it}$ and/or the recombination velocity S of a material, the less defects in the material.

In order to passivate a silicon surface to achieve a low interface state density and/or a low recombination velocity, an oxide layer of $SiO_x$ (x=any number) is sometimes formed over the silicon surface. In a sense, the oxide ties up the dangling bonds of the defects. Typically, a very thin (approximately 100 Å) $SiO_x$ layer is used in high-efficiency silicon solar cells, metal-oxide semiconductor field-effect transistors (MOSFET), and advanced bipolar devices. In regard to solar cells, see M. A. Green, *High Efficiency Silicon Solar Cells*, Trans. Tech. Aedermannsdorf, 1987, and in regard to bipolar devices, see J. Ahn, et al., *IEEE Electron Device Lett.*, EDL-13, 186 (1992). However, the techniques in the industry for forming the $SiO_x$ layer on the silicon surface generally require undesirable high temperature processing steps. The thin $SiO_x$ layer is typically formed by oxidation at temperatures greater than 700° C. High temperature process steps can limit the degree of miniaturization and can also degrade the quality of starting material.

The deposition of oxides on silicon at low temperature is extremely desirable for achieving greater flexibility in a process sequence, tight dimensional control, and preservation of minority carrier lifetime. Low temperature processing becomes increasingly important as the limits of integration or number of devices on an integrated circuit (IC) chip is increased. Low temperature processing is also crucial for discrete devices, for instance, solar cells as lower quality silicon materials are used to reduce cost of photovoltaic devices. Moreover, the use of a low temperature deposition oxide, such as $SiO_x$, would be desirable in order to maintain device dimensions within tight tolerance and reduce the process-induced degradation of bulk lifetime. Unfortunately, low-temperature processing generally produces low-quality oxides with high interface state density $D_{it}$ and high recombination velocity S. In this regard, see E. H. Nicollian et al., MOS (Metal Oxide Semiconductor) *Physics and Technology*, Wiley, N.Y., 1982.

Thus, there is currently much ongoing research in the industry in developing techniques for producing high quality oxides at low temperature. Many of these techniques utilize plasma-enhanced chemical vapor deposition (PECVD) to deposit oxides. Remote PECVD and plasma oxidation has recently produced a high quality $SiO_x$/Si interface with a interface state density $D_{it}$ of approximately $1.7 \times 10^{10}$ cm$^{-2}$ eV$^{-1}$, but the direct PECVD process gives $D_{it}$ values of approximately $5 \times 10^{10}$ cm$^{-2}$eV$^{-1}$. These $D_{it}$ values are slightly higher, but nearly comparable, to thermally grown oxides at high temperatures.

Table A, which is set forth hereafter, summarizes some of the recent developments relative to PECVD oxides, along with the oxide interface formation techniques used to obtain low $D_{it}$ at low temperatures. In most prior art techniques using low temperature PECVD to deposit oxides, attention has been focused on the interface formation technique during the oxide growth, rather than on the post-deposition treatments.

TABLE A

| Ref/Year | Interface Formation Technique | $T_{dep}$ (°C.) | Post-Anneal Condition | $D_{it}$ (cm$^{-2}$eV$^{-1}$) |
|---|---|---|---|---|
| 1/1988 | Remote PECVD in situ hydrogen plasma treatment | 300 | 400° C. in $N_2$, 30 min | $3.7 \times 10^{10}$ |
| 2/1991 | Low rate plasma oxidation | 350 | | $2.2 \times 10^{10}$ |
| 3/1992 | Remote PECVD, wet HF etching, plasma oxidation | | 400° C. in 10, Torr. 5 min. 400° C. in $N_2$, 30 min. | $1.7 \times 10^{10}$ |
| 4/1986 | Direct PECVD, slow rate (60 Å/min) | 350 | 400° C. in forming gas, 30 min | $4 \times 10^{10}$ |
| 5/1991 | Direct PECVD, two temperature, | 300–350 | 300° C. in forming gas, | $5.3 \times 10^{10}$(p) |

TABLE A-continued

| Ref/Year | Interface Formation Technique | $T_{dep}$ (°C.) | Post-Anneal Condition | $D_{it}$ (cm$^{-2}$eV$^{-1}$) |
| --- | --- | --- | --- | --- |
| | in situ H plasma treatment | | 60 min | $4.0 \times 10^{10}$(n) |

It is also important to recognize that there is a fundamental difference between deposited oxides and thermally-grown oxides. In thermally-grown oxides, the SiO$_x$/Si interface is formed at the end of the process and is located underneath the native oxide. In the case of deposited oxides, the deposition takes place on top of the native oxide, and the native oxide stays at the interface. Consequently, the interface property of the deposited oxides depends strongly on the native oxide. Therefore, the interface formation technique is more critical for obtaining low interface state density $D_{it}$ in the PECVD oxides.

As indicated in Table A, in a known remote PECVD technique, excited species from a remote oxygen plasma interact with silane (SiH$_4$) in the deposition zone to avoid ion bombardment damage on the surface. In addition, the use of in situ hydrogen plasma treatment to reconstruct the silicon surface just prior to the deposition was also believed to be a key factor in obtaining low interface state density $D_{it}$ of about $3.7 \times 10^{10}$ cm$^{-2}$eV$^1$.

Low growth rate plasma oxidation of silicon in dilute oxygen/helium plasma is another promising technique known in the art, as is indicated in Table A. In this technique, a plasma growth oxide forms a high quality interface below the original native oxide, and then the conventional PECVD oxide is deposited on top of the native oxide. Thus, the interface is dominated by a good quality plasma grown oxide rather than the native oxide or the PECVD oxide. A low interface state density $D_{it}$ value of about $2.2 \times 10^{10}$ eV$^{-1}$ cm$^{-2}$ was reported using this technique in A. A. Bright et al., *Appl. Phys. Lett.* 58, 619 (1991).

Another known technique utilizes the combination of remote PECVD and plasma oxidation technique, along with wet hydrogen fluoride etching of the native oxide just prior to the deposition. This technique can produce a interface state density $D_{it}$ as low as about $1.7 \times 10^{10}$ eV$^{-1}$ cm$^{-2}$, which is comparable to oxides prepared by thermal oxidation. In this regard, see T. Yasuda et al., *Appl. Phys. Lett.* 60, 434 (1992).

Even though the PECVD and plasma oxidation techniques have successfully produced low interface state densities $D_{it}$, it still remains difficult to grow such oxides in a commercial PECVD reactor because very low pressure (<10$^{-8}$ Torr) is required, as is described in G. G. Fountain et al., *J. Appl. Phys.* 63, 4744 (1988) and T. Yasuda et al., *Appl. Phys. Lett.* 60, 434 (1992). Moreover, the growth rate (approximately, 3 Å/min) is very slow, as is described in A. A. Bright et al., *Appl. Phys. Lett.* 58, 619 (1991). On the other hand, direct PECVD is more desirable for commercial scale reactors because PECVD can work at 0.1–1 Torr pressures and the deposition rate is a few hundred angstroms per minute.

In J. Batey et al., *J. Appl. Phys.* 60, 3136 (1986), it was first reported that low temperature direct PECVD could result in a interface state density $D_{it}$ in the range of mid $10^{10}$–$10^{11}$ cm$^{-2}$eV$^{-1}$ by using relatively low growth rate of 60 Å/min, rather than the 500 Å/min growth rate in conventional PECVD.

A two-temperature PECVD technique is described in J. S. Herman et al., *IEEE Electron Devices Lett.* 12, 236 (1991). In this technique, the interface was formed at 300° C. Hydrogen plasma treatment was found to be important for the low interface state density $D_{it}$. The $D_{it}$ value was reported at about $5 \times 10^{10}$ cm$^{-2}$ eV$^{-1}$.

Although the prior art techniques are meritorious to an extent, there is still a significant need in the industry for a low temperature technique for passivating silicon so that the silicon surface exhibits a lower interface state density $D_{it}$ and a lower surface recombination velocity S than in silicon which is passivated utilizing prior art techniques.

SUMMARY OF TEE INVENTION

An object of the present invention is to overcome the problems and inadequacies in regard to the prior art as noted above and as generally known in the industry.

Another object of the present invention is to provide a method for passivating a surface of silicon at low temperature to achieve both low interface state density $D_{it}$ and low surface recombination velocity S at the surface, while preserving high minority carrier lifetime.

Another object of the present invention is to provide a method for passivating a surface of silicon using low temperature PECVD.

Another object of the present invention is to provide a method for passivating a surface of silicon using low temperature PECVD and oxides SiO$_x$.

Another object of the present invention is to provide a method for reducing the interface state density $D_{it}$ and the recombination velocity S at a SiO$_x$/Si interface.

Another object of the present invention is to provide a low temperature surface passivation technique that can also passivate defects in bulk silicon.

Another object of the present invention is to provide a method for reducing leakage current for diffused junctions in Si devices.

The present invention provides methods for passivating silicon at the surface and in the bulk region of the silicon. The methods can be used to produce, at the surface of silicon and at low temperature, high quality oxides and nitrides having both low interface state density $D_{it}$ and low surface recombination velocity S, while preserving minority carrier lifetime and high recombination lifetime in the bulk. The present invention also provides for effective surface passivation of silicon emitters or diffused junctions with low leakage current.

The novel method involves the following steps. Using PECVD, a thin silicon oxide layer (SiO$_x$) is deposited or formed over a silicon surface. The silicon may be n-doped or p-doped silicon. The SiO$_x$ layer is about 10 nm in thickness in the preferred embodiment and is deposited at about 250° C. The SiO$_x$ layer then undergoes a photo-assisted rapid thermal annealing (RTA) process in a forming gas at about 300° C. to 350° C. for at least 20 minutes. The forming gas preferably has hydrogen (H$_2$; source of H$^+$) and is provided over the SiO$_x$ during the RTA process. The preferred embodiment utilizes a forming gas of 90 percent ambient nitrogen ($N_2$) and 10 percent hydrogen ($H_2$). The hydrogen further passifies the silicon surface and bulk defects within the internal region of the silicon.

Optionally, the method may be modified to include one or more of the following steps. A thin 60 nm SiN layer is deposited over the oxide layer $SiO_x$ at preferably about 275° C., prior to the anneal, in order to further minimize interface state density $D_{it}$ and surface recombination velocity S. A thin aluminum layer is deposited over the oxide layer $SiO_x$ via an evaporation technique, prior to the anneal, in order to further minimize interface state density $D_{it}$ and surface recombination velocity S.

By using the 10 nm $SiO_x$, the present invention gives a desirable surface recombination velocity S of less than about 2 cm/s, an effective lifetime of greater than about 5 ms, and a bulk lifetime of greater than about 20 ms maintained for high resistivity (>500 ohm-cm) float zone silicon. Moreover, very low interface state density $D_{it}$ in the approximate range of $1-4\times10^{10} cm^{-2} eV^{-1}$ for PECVD $SiO_x$/Si interface has been routinely produced on 10 ohm-cm silicon by the present invention. The present invention also provides very effective emitter surface passivation, low leakage current density for phosphorus diffused junction in the approximate range of $4-60\times10^{-14} A/cm^2$, depending on the surface concentration, has been achieved. Detailed analysis conducted by the inventors shows that the PECVD deposition conditions, photo-assisted anneal, forming gas ambient, the presence of an aluminum layer during the anneal, and cleaning procedure for silicon wafer and RF chamber, all contribute to the desirable properties achieved by the present invention.

In addition to achieving the objects set forth previously, the present invention has many other advantages, a few of which are denoted hereafter.

An advantage of the present invention is that a $SiO_x$/Si interface can be produced with an interface state density $D_{it}$ which is two to four times lower than any other $SiO_x$/Si interface produced using prior art low temperature direct PECVD techniques.

Another advantage of the present invention is that a $SiO_x$/Si interface can be produced with a recombination velocity S of about 1 cm/second, which is very low and optimum.

Another advantage of the present invention is that a $SiO_x$/Si interface can be produced while preserving high minority carrier lifetime in the silicon.

Another advantage of the present invention is that it can be used to passify an emitter so that the emitter saturation current $J_0$ is minimized.

Another advantage of the present invention is that it can be applied in solar cells, photoelectronic sensors, MOS devices, and junction devices, such as photovoltaic devices and larger area power devices.

Another advantage of the present invention is that both surface and bulk defects can be passivated in silicon at low temperature to achieve both low interface state density and low surface recombination velocity within the internal region of the silicon. Thus, if desired, lower cost, low quality silicon having numerous defects could be utilized and could be processed in accordance with the present invention to transform the lower quality silicon to a much higher quality material having few defects.

Another advantage of the present invention is that it is simple to implement.

Another advantage of the present invention is that it is performed in a short period of time.

Another advantage of the present invention is that it has a low thermal budget.

Another advantage of the present invention is that it is a commercially viable process due to its simplicity, safety, and requisite operation time.

Another advantage of the present invention is that a high vacuum system is not needed.

Another advantage of the present invention is that a high temperature furnace is not needed.

Other objects, features, and advantages of the present invention will become apparent to one with skill in the art upon examination of the following drawings and detailed description. It is intended that all such additional objects, features, and advantages, which are not explicitly mentioned but are implicit from the discussion in this document, be included herein within this disclosure and within the scope of the present invention.

BRIEF DESCRIPTION OF THE DRAWINGS

The present invention can be better understood with reference to the following drawings.

DETAILED DESCRIPTION OF TEE PREFERRED EMBODIMENTS

Figure 1:
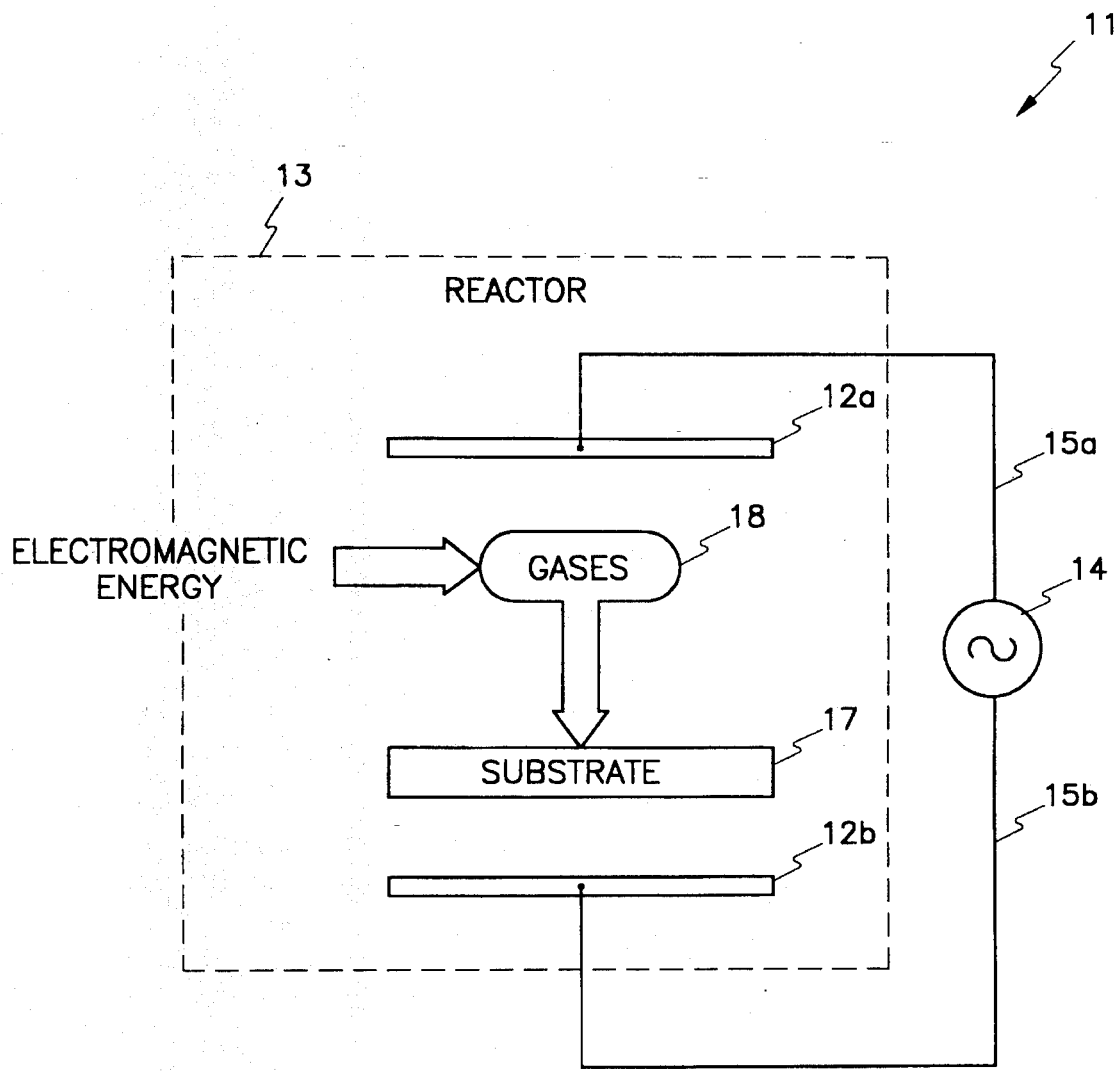
FIG. 1 is a schematic diagram of a conventional PECVD system.

Direct low temperature PECVD in conjunction with a subsequent photo-assisted anneal was used to achieve a record low interface state density $D_{it}$ in metal-oxide-semiconductor (MOS)(Al/oxide/Si) structures. The PECVD process and systems for performing the PECVD process are well known in the art. However, for the purpose of better understanding the present invention, a typical PECVD system 11 is illustrated in FIG. 1. As shown in FIG. 1, the PECVD system 11 has generally planar opposing electrode plates 12a, 12b situated within a reactor 13. In the preferred embodiment, the reactor 13 is a commercial Plasma-Therm 700 series reactor. The electrodes 12a, 12b are connected to and energized by an alternating current (AC) power source 14 via respective electrical lines 15a, 15b. Preferably, the power source 14 is a conventional 13.56 MHz RF power source. A substrate 17, preferably a silicon wafer in the present invention, is disposed between the electrodes 12a, 12b, and gases 18 are passed over the substrate 18, as shown. Electromagnetic energy (for instance, by RF waves) is imparted to the gases 18 to thereby inject energy into and excite the gases 18. Generally, the gases 18 tend to glow or arc as a result of the excitation, and the excited gases 18 are referred to as a plasma. The excitation by the electromagnetic energy causes a reaction(s) between the constituents of the gases 18 and, consequently, a layer is deposited on the substrate 17. PECVD is advantageous because deposition can occur at low temperatures.

EXPERIMENT I

P-type <100> floating zone silicon wafers with approximately 10 Ω cm resistivity were used in this experiment. The front side of the wafers was mechanically polished and the back side was chemically etched. Prior to oxide deposition, the wafers were cleaned as follows: (a) Ultrasonic degreasing in solvents (TCE, acetone, methanol), followed by running de-ionized (DI) water rinse; (b) soak in HF(1):H$_2$O(10) for 1 min and DI water rinse; (c) boil in HCl(1):H$_2$O$_2$(1):H$_2$O(5) for 8 min followed by DI water rinse; and (d) soak in agitated HF(1):HNO$_3$(50) for 30 seconds followed by DI water rinse. Just before the PECVD deposition in the reactor 13 of FIG. 1, the wafers were dipped in HF(1):H$_2$O(10) for 1 min, rinsed in running DI water for 30 seconds, and then blown dry with N$_2$. This step was important for obtaining reproducible results and mitigating the undesirable effects of the native oxide on the interface. Samples were then loaded into the PECVD system 11 of FIG. 1 for pump down. The time lag between the drying to pump down was typically 1 min.

The top electrode 12a was maintained at about 80° C. and the temperature of the substrate 17 was kept at about 250° C. A low power level of 20 W (about 0.02 W/cm$^2$) was used to prevent surface damage by ion bombardment. A mixture of 2% SiH$_4$ and 250 sccm for N$_2$O was utilized as the gases 18 over the substrate 17. The total reactor pressure in reactor 13 was maintained at 0.3 Torr. Under these conditions the growth rate was about 100 Å/min. About 500 Å PECVD SiO$_x$ was deposited on the front side of the wafers followed by thermal evaporation of 2000 Å aluminum for the front gate electrode and backside contact.

The samples were then subjected to a photo-assisted anneal in a rapid thermal annealing (RTA) system at a temperature of about 350° C. in a forming gas ambient for approximately 20 min. RTA systems are well known in the art. The RTA system was heated by tungsten halogen lamps. Moreover, all the experiments described in this document were conducted in a class 1000 clean room.

The interface state density $D_{it}$ of the SiO$_x$/Si interface was determined by conventional high-low frequency capacitance-voltage (C–V) measurements. The high frequency C–V was measured at 1 MHz and quasistatic (QS) C–V was measured by voltage ramp method with a ramp rate of 0.1 V/s.

Figure 2A:
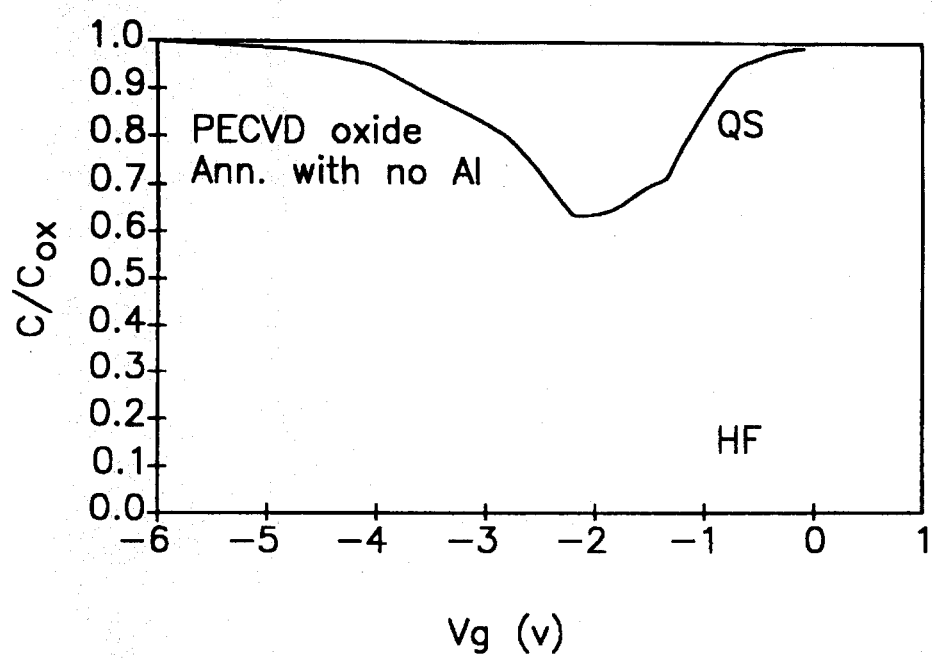
FIG. 2A is a graph of measured high frequency (HF) and quasi-static (QS) C–V data ($C/C_{ox}$ versus $V_g$) on MOS capacitors wherein an oxide was formed in forming gas ambient without an aluminum layer.
Figure 2B:
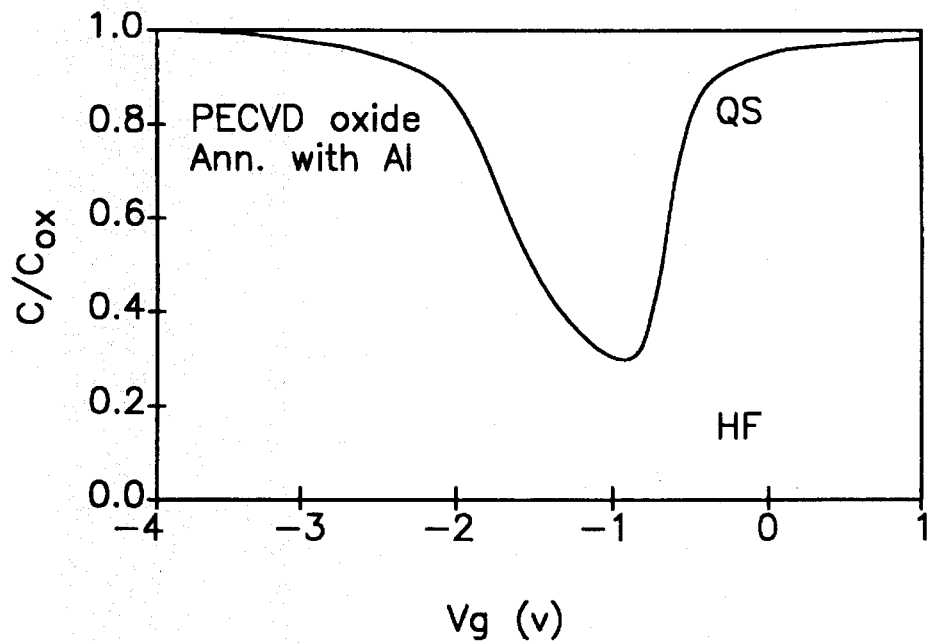
FIG. 2B is a graph of measured HF and QS C–V data ($C/C_{ox}$ versus $V_g$) on MOS capacitors wherein an oxide was formed in forming gas ambient with an aluminum layer.

Three sets of samples with identical PECVD deposition, but with different post-deposition treatments, were tested to evaluate the effect of post-deposition treatments on interface state density $D_{it}$. The first set of samples, which saw no treatment at all after the PECVD deposition, gave interface state density $D_{it}$ values of above $10^{12}$ cm$^{-2}$eV$^{-1}$. The second set of samples were subjected to a photo-assisted anneal in forming gas without the aluminum layer on top of the oxide and the aluminum gate electrode with size 0.785 mm$^2$ was evaporated after the anneal. FIG. 2A shows typical high-low frequency C–V curves for group 2 MOS capacitors which gave an average $D_{it}$ value of $4.0 \times 10^{11}$ cm$^{-2}$ eV$^{-1}$. The third set was subjected to a photo-assisted anneal in forming gas after the aluminum electrode was evaporated on top of the oxide. Typical high-low frequency curves are shown in FIG. 2B. The third set gave a typical $D_{it}$ value of approximately $3.3 \times 10^{10}$ cm$^{-2}$ eV$^{-1}$ with the best $D_{it}$ value of $1.1 \times 10^{10}$ cm$^{-2}$ eV$^{-1}$ at midgap, which is comparable to the thermal oxides. However, the positive charge in these PECVD oxides was of the order of $10^{11}$ cm$^{-2}$, which is much higher than the thermal oxides.

FIGS. 2A and 2B clearly demonstrate the beneficial effect of aluminum during the photo-assisted anneal, because it reduces the $D_{it}$ value by more than one order of magnitude. The merit of having an aluminum layer during the annealing process has also been reported for thermal oxides. In this regard, see E. H. Nicollin et al., *MOS Physics and Technology*, Wiley, N.Y. (1982). It has been suggested that the presence of Al helps to generate atomic hydrogen during the forming gas anneal, which ties up the dangling bonds and reduce $D_{it}$. Our results in FIGS. A and 2B show that the PECVD oxides also respond favorably to the presence of aluminum during the anneal. It should be mentioned that there is some spread in the $D_{it}$ values from MOS capacitors located on the same wafer. The range of midgap $D_{it}$ value for the samples treated by the photo-assisted anneal with an aluminum layer was $1-4 \times 10^{10}$ cm$^{-2}$ eV$^{-1}$.

Figure 3A:
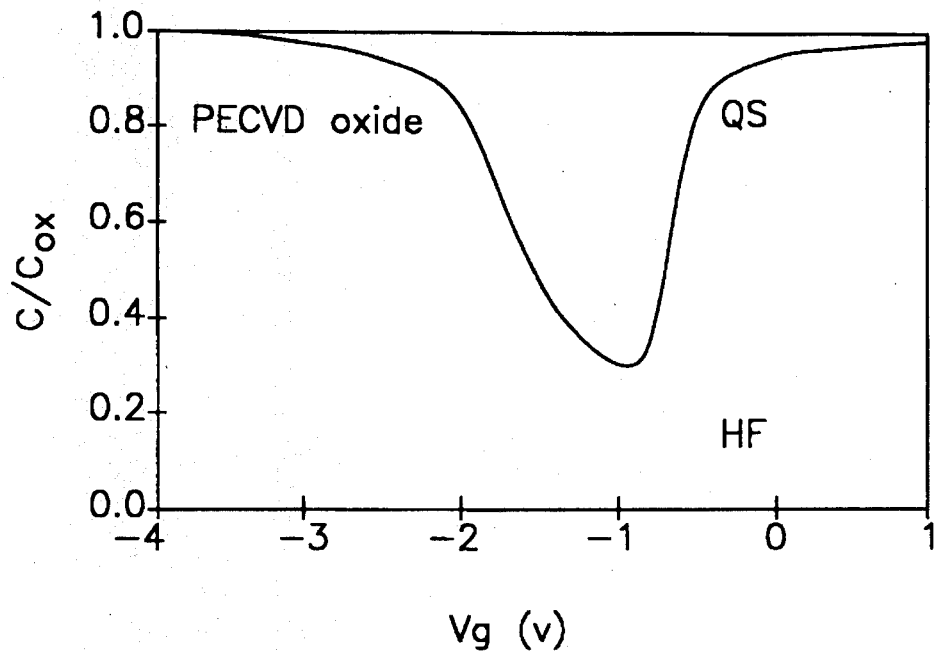
FIG. 3A is a graph of HF and QS C–V data ($C/C_{ox}$ versus $V_g$) for a best MOS capacitor with PECVD oxide.
Figure 3B:
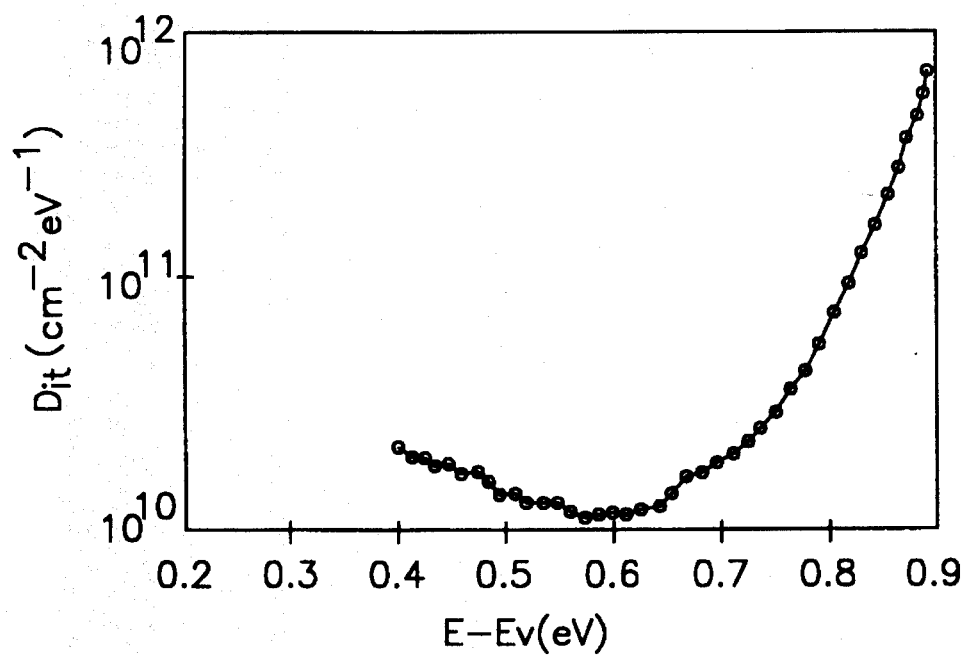
FIG. 3B is a graph of the interface state density $D_{it}$ ($D_{it}$ versus $E-E_v$) for the best MOS capacitor of FIG. 3A showing a minimum interface state density $D_{it}$ around a midgap of $1.1\times10^{10} eV^{-1}cm^{-2}$.

FIG. 3A shows the best C–V characteristics measured on a MOS capacitor with the PECVD oxide. The near-ideal C–V curve endorses the excellent interface quality. The $D_{it}$ spectrum calculated from the high-low frequency curve of FIG. 3A is shown in FIG. 3B, which shows a minimum interface state density $D_{it}$ value of $1.1 \times 10^{10}$ cm$^{-2}$ eV$^{-1}$ at the midgap. This represents the lowest interface state density $D_{it}$ value achieved to date in the industry for PECVD oxides.

EXPERIMENT II

Samples of the silicon with SiO$_x$ layer were subjected to conventional furnace anneal at 400° C. in the forming gas for 30 min after the PECVD oxide deposition and aluminum evaporation as described in Experiment I, which discussion is incorporated herein by reference. The $D_{it}$ value for these samples was found to be in the range of $4 \times 10^{10} - 10^{11}$ eV$^{-1}$ cm$^{-2}$, with the lowest value of $4.2 \times 10^{10}$ eV$^{-1}$ cm$^{-2}$. These values are consistent with the results reported in the reference in the fourth position of Table A. From the comparison between the furnace and photo-assisted anneal experiments, it is clear that optical effect during the photo-assisted rapid thermal anneal process is important. Some investigators have attributed the positive effects of photo-annealing to the electronic excitations which can promote additional reactions. For example, consider R. Singh, *Appl. Phys. Lett.*, v.

58, p. 1217, (1991). At this time, the exact mechanism cannot be explained.

In addition to the PECVD growth conditions, use of photo-assisted anneal, Al layer, forming gas ambient, and careful wafer and PECVD chamber cleaning was important for achieving such low interface state density $D_{it}$. It was determined that a dirty PECVD reactor 13 (FIG. 1) can result in an interface state density $D_{it}$ greater than $10^{11}$ eV$^{-1}$ cm$^{-2}$, with all other conditions being the same.

In conclusion, Experiments I and II show the importance of a post-deposition annealing treatment for an oxide deposited using PECVD. It is shown that the combination of photo-assisted anneal, forming gas ambient, and the presence of aluminum layer during the anneal is a very effective post-deposition treatment for Si/SiO$_x$ interface defect passivation. Without any post-deposition treatment, PECVD oxides gave a $D_{it}$ value about $10^{12}$ cm$^2$ eV$^1$. The photo-assisted anneal at 350° C. in forming gas reduced the $D_{it}$ value to about $10^{11}$ cm$^{-2}$ eV$^{-1}$. Finally, the photo-assisted anneal in forming gas with the Al layer on top of the oxide gave interface state density $D_{it}$ in the range of about $1-4\times10^{10}$ cm$^{-2}$ eV$^{-1}$, with the best $D_{it}$ value of about $1.1\times10^{10}$ cm$^{-2}$ eV$^{-1}$. This sets a new record in the industry for the lowest interface state density $D_{it}$ in direct PECVD oxides fabricated to date.

The method of the present invention also provides for low surface recombination velocity S and high effective lifetime in silicon, as is described hereafter relative to Experiment III.

EXPERIMENT III

Samples of the silicon with SiO$_x$ were subjected to conventional furnace anneal at 400° C. in the forming gas for 30 min after the PECVD oxide deposition as described in Experiment I, which discussion is incorporated herein by reference.

For photoconductive voltage decay (PCD) lifetime measurements, first the voltage decay transient V(t) from a PCD tester was converted to carrier concentration transient and then the effective lifetime $T_{eff}$ at various injection levels is determined by the following equation:

$$\frac{1}{\tau_{eff}} = -\frac{1}{N}\frac{dN}{dt} \quad (1)$$

where N is the injected carrier concentration. See A. Rohatgi, Z. Chen, P. Sana, S. K. Pang, R. S. Ramanachalam, W. A. Doolottle, G. Crotty, and J. Salami, Annual Technical Report to National Renewable Energy Laboratory, March 1993. For low surface recombination velocity S, the effective lifetime $T_{eff}$, bulk lifetime $T_b$, and surface recombination velocity S are related according to the following equation:

$$1/T_{eff} = (1/T_b) + (2S/L) \quad (2)$$

where L is the sample thickness which was varied in the range of 5–9 mils in our measurements.

The interface state density $D_{it}$ and oxide charge density were determined by high-frequency and quasistatic C–V measurements on metal-oxide semiconductor (MOS) capacitors. The measurements were done on identical oxide deposited on 0.2 Ω cm Si wafers, instead of the 500 Ω cm or higher samples, because of the difficulty in MOS measurements on the high-resistivity substrates.

Figure 4:
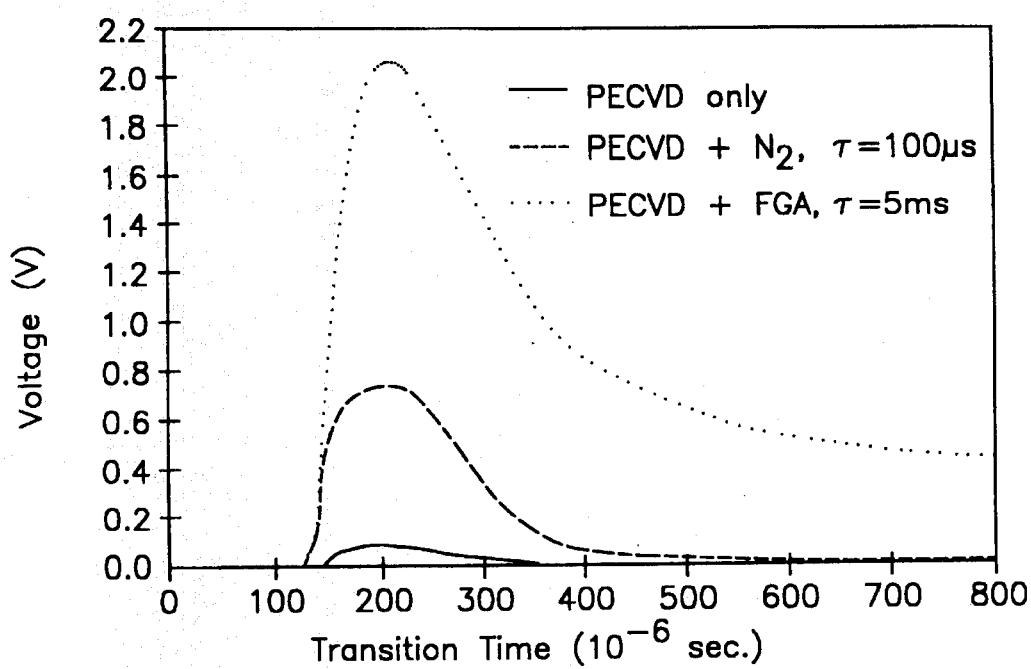
FIG. 4 is a graph of photoconductive voltage decay transients (voltage versus transition time) for silicon samples with different treatments: (a) thin PECVD $SiO_x$ on Si; (b) PECVD $SiO_x$ on Si which is annealed in $N_2$ ambient using RTA; and (c) PECVD $SiO_x$ on Si which is annealed in forming gas ambient using RTA.

FIG. 4 shows photoconductive voltage decay curves for PECVD oxides subjected to different treatments: (a) as-grown PECVD oxide with no annealing; (b) PECVD oxide deposition followed by RTA in N$_2$ ambient; and (c) PECVD oxide deposition followed by RTA in forming gas ambient. It can be seen from FIG. 4 that the annealed PECVD oxides gave a much stronger signal compared to the unannealed oxide which has very high recombination velocity S at the SiO$_x$/Si interface. FIG. 4 demonstrates that the RTA process is important for maintaining high effective lifetime, and the forming gas produces much better results compared to the N$_2$ ambient. The measured effective lifetimes were 5 ms and 100 µs for the forming gas and N$_2$ ambient, respectively. These results suggest that the presence of 10% hydrogen in the forming gas plays an important role in improving the interface.

EXPERIMENT IV

A comparison is also made between the furnace-annealed and rapid-thermal-annealed (RTA) samples in forming gas ambient. Samples of the silicon with SiO$_x$ were subjected to furnace annealing and RTA, separately, to analyze the effects. The annealing temperatures and time were kept the same for both cases. The lifetime dependence on RTA temperature was studied in the temperature range of 300°–450° C. The measured effective lifetimes for furnace and rapid-thermal-annealed samples are listed in Table B hereafter, which shows that the RTA process results in higher effective lifetime than the furnace anneal for the same temperature. The furnace anneal temperature had to be raised to come close to the RTA results. This suggests that the additional optical heating during the RTA process makes hydrogen passivation of the interface defects more efficient. The effective lifetime is sensitive to the annealing temperature because hydrogenation of the interface defect is closely related to the temperature. Table B also indicates that the RTA annealing temperature of 350° C. is optimum, probably because annealing at higher temperature results in evolution of hydrogen rather than passivation of the interface.

TABLE B

Temperature Effect On $\tau_{eff}$ In RTA And Furnace Anneal

| Temperature (°C.) | $\tau_{eff}$ after RTA Anneal (ms) | $\tau_{eff}$ after furnace anneal (ms) |
|---|---|---|
| 300 | 1.1 | — |
| 350 | 5.5 | 1.0 |
| 400 | 4.7 | 4.2 |
| 450 | 4.1 | 1.6 |

EXPERIMENT V

Figure 5:
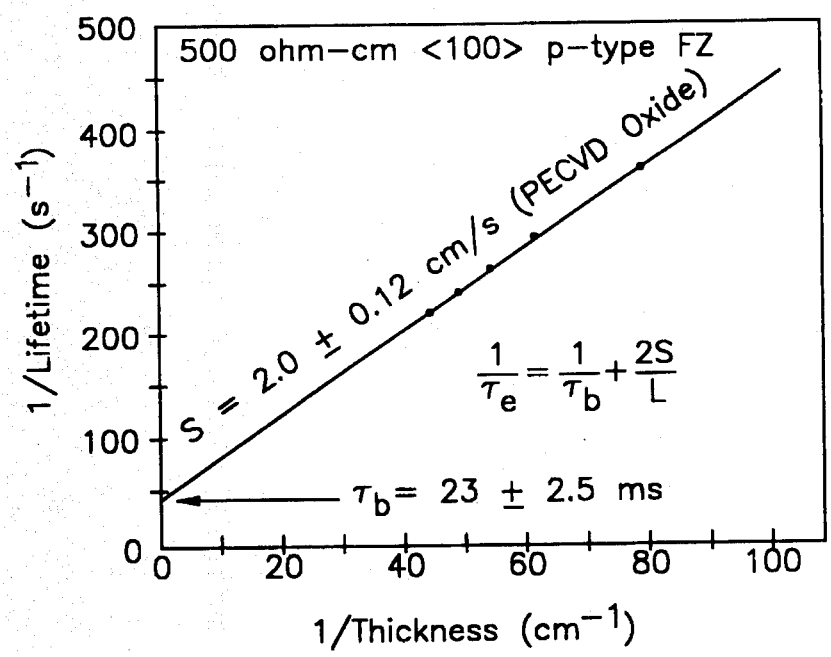
FIG. 5 is a graph of $1/T_{eff}$ versus $1/L$ which gives the recombination velocity S and the bulk lifetime $T_b$ (intercept on $1/T_{eff}$ axis)

The effect of the oxide on the interface recombination velocity S was also explored. Interface recombination velocity S and true bulk lifetime $T_b$ were determined by measuring $T_{eff}$ on the annealed oxide wafers with five different thicknesses L. FIG. 5 shows a typical $1/T_{eff}$ versus $1/L$ plot where the intercept of the straight line corresponds to $T_b$, and the slope gives the S value. $T_b$ and S were 23 ms and 2 cm/s, respectively, at an injection level of $5\times10^{14}$ cm$^{-3}$. The S value showed an increase from 2 to 30 cm/s when the injection level was increased from $5\times10^{14}$ to $1\times10^{16}$ cm$^{-3}$. It should be recognized that recombination velocity S is a strong function of SiO$_x$/Si interface state density $D_{it}$, positive charge density in the oxide, carrier injection level, and capture cross section for electrons and holes. See T. Warabisako et al., *Technical Digest of the International*, v. PVSEC-5, p. 583 (1990); A. G. Aberle et al., *J. Appl. Phys.*, v. 71, p. 4422 (1992) and R. B. M. Girisch et al., *IEEE Trans.*

*Electron Devices*, ED-35, p. 203 (1988).

The inventors herein have developed a theoretical model to calculate the effect of these parameters on the recombination velocity S. The low S value can be either due to low-interface state density $D_{it}$ or high density of positive charge in the PECVD oxide, or a combination of both. If the positive charge density is larger than the interface state density $D_{it}$, it will cause significant downward bending of the energy band, increasing the difference in electron and hole concentration in the region near the $SiO_x/Si$ interface and resulting in reduced recombination at the interface. High and low-frequency C–V measurements on the PECVD oxides showed a large flat-band voltage shift with positive charge density in the range of $5 \times 10^{11} – 1 \times 10^{12}$ cm$^{-2}$, and interface state density $D_{it}$ in the range of $1 \times 10^{10} – 5 \times 10^{10}$ cm$^{-2}$ eV$^{-1}$ at midgap. Since the C–V measurements were done on low-resistivity (0.2 Ω cm) samples, interface state density $D_{it}$ may be slightly different from that for the high-resistivity samples used for S and T measurements by PCD measurements. However, the positive charge in oxides may be virtually the same for both the high and low-resistivity samples.

Figure 6:
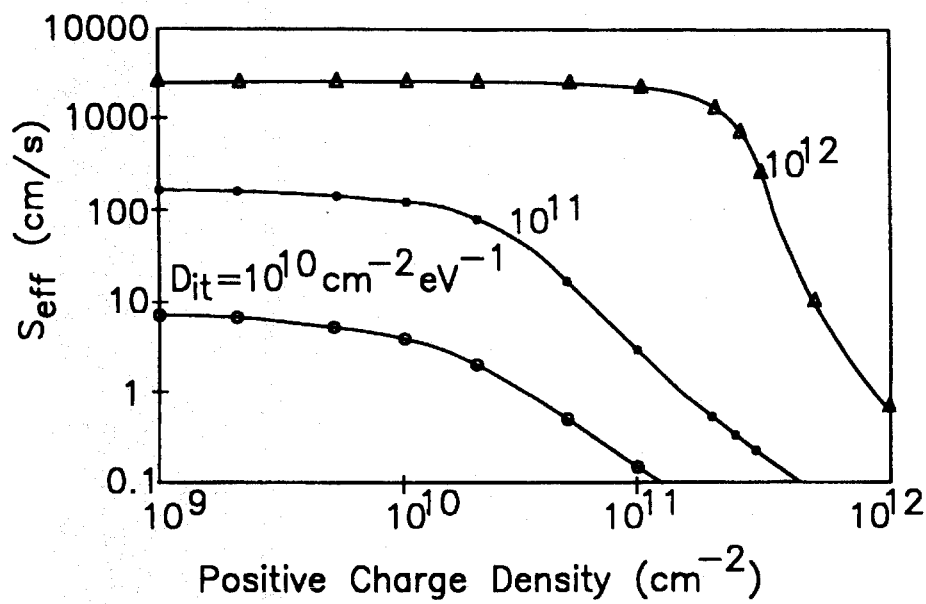
FIG. 6 is a graph of a calculated positive charge effect (effective recombination velocity $S_{eff}$ versus positive charge density) on recombination velocity S by a simplified model using uniform distribution of interface states.

Model calculations in FIG. 6 demonstrate quantitatively the relationship between the recombination velocity S and positive charge at an injection level of $5 \times 10^{14}$ cm$^{-3}$, assuming uniform interface state density $D_{it}$ with electron and hole cross sections are assumed of $10^{-14}$ and $10^{-16}$ cm$^2$, respectively. See R. B. M. Girisch et al., *IEEE Trans. Electron Devices*, ED-35, 203 (1988). According to FIG. 6, the positive charge in the range of $1–5 \times 10^{11}$ cm$^{-2}$ can significantly reduce the interface recombination velocity S, if the interface state density $D_{it}$ is in the range of $5–10 \times 10^{10}$ cm$^{-2}$.

Oxide charge is undesirable for integrated-circuit devices because it affects the threshold and breakdown voltage, and the films reported here may not be good enough for complimentary MOS (CMOS) applications. However, for devices such as high-efficiency solar cells in which the surface recombination is of major concern rather than oxide charge, the positive charge of PECVD oxide can indeed be very helpful in reducing the interface recombination to improve device performance. It should be recognized that if the PECVD oxides are used in concentrator cells, where the injection can exceed $10^{16}$ cm$^{-3}$, the interface recombination velocity S can reach as high as 30–60 cm/s based on our experimental measurements.

EXPERIMENT VI

Figure 7:
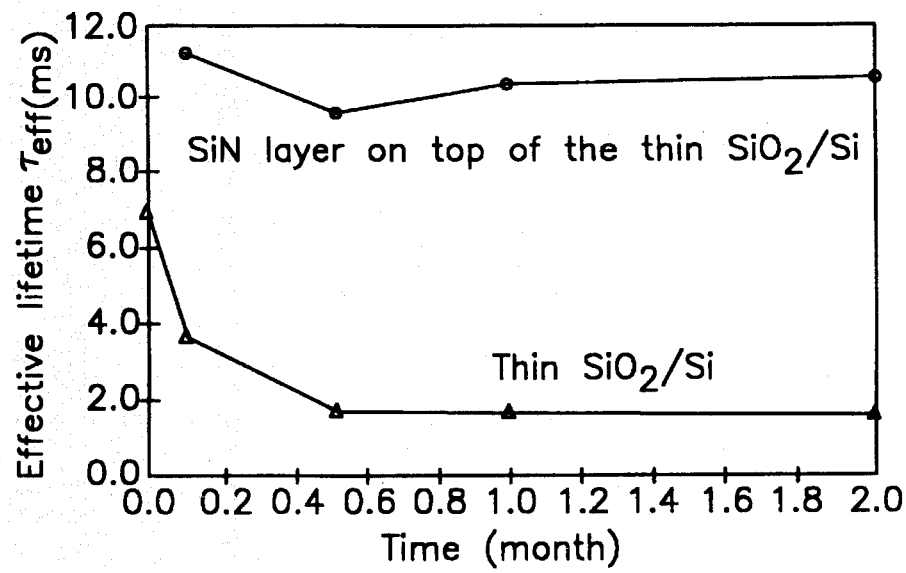
FIG. 7 is a graph of effective lifetime degradation (effective lifetime $T_{eff}$ versus time) over a 2 month period for a PECVD $SiO_x$/Si layer and a combination of a SiN layer atop a PECVD $SiO_x$/Si layer.

The stability of the thin PECVD $SiO_x/Si$ interface was investigated because the increase in interface recombination velocity S with UV light exposure has been reported for high-quality thermal oxides. In this regard, consider P. E. Gruenbaum et al., *Appl. Phys. Lett.* 52, 1407 (1988). Some investigators have also shown that the presence of moisture near the interface increases not only negative charges in oxides but also the recombination center density at the interface. For example, see E. H. Nicollian, *J. Vac. Sci. Technol.*, v. 14, p. 1118 (1977), and E. H. Nicollian et al., MOS (Metal Oxide Semiconductor) *Physics and Technology*, Chapter 11, Wiley, N.Y. (1982). Therefore, a protective layer on top of the oxide, such as a metal contact in MOS devices or antireflection coating in solar cells, can have a significant impact on the stability. When the unprotected PECVD oxide was exposed to the air for several days the effective lifetime was found to decrease with time, as shown in FIG. 7. The exact reason for this decay is not fully understood at this time. However, the role of moisture cannot be ruled out, since thinner oxides showed faster degradation. It is also important to note that the reduced effective lifetime can be fully restored by reannealing the oxides.

An attempt was made to prevent this degradation by depositing a PECVD SiN layer on top of the oxide. FIG. 7 shows the variations in $T_{eff}$ with time for a duration of 2 months, for the unprotected thin $SiO_x$ as well as SiN-protected $SiO_x$. In the case of unprotected $SiO_x$, $T_{eff}$ decreased from 7 to 3.7 ms in 3 days and to 1.5 ms in 1 month before stabilizing. In contrast, thin $SiO_x$ capped with SiN was found to be extremely stable and showed virtually no degradation for the period of 2 months. The SiN layer, which is known to block the moisture from reaching the interface, may therefore contribute to the stability improvement. It is interesting to note that the SiN layer not only successfully prevents the degradation but also gives a higher effective lifetime (>10 ms) and very low S (<1 cm/s). A large amount of hydrogen in the PECVD SiN films, detected by Fourier transform infrared (FTIR), along with the additional positive charge in the SiN ($\geq 10^{12}$ cm$^{-2}$) may be responsible for such a low S and high $T_{eff}$. FTIR is described in A Rohatgi, Z. Chen, W. A. 20 Doolottle, J. Salami, and P. Sana, Final Technical Report to National Renewable Energy Laboratory, March 1992. In addition, the value of the recombination velocity S in the SiN-capped PECVD oxide only went up to 15 cm/s at the injection level of $10^{16}$ cm$^{-3}$.

In conclusion, Experiments III–VI show that for the first time direct PECVD $SiO_x$ deposition at 250° C. followed by RTA at 350° C. can result in a high effective lifetime (>5 ms) and very low recombination velocity S ($\leq 2$ cm/s). Such a low temperature process retains the true bulk lifetime which was found to be 23 ms after the PECVD and RTA processes. MOS measurements coupled with model calculations confirmed that the high effective lifetime and low surface recombination velocity S results from the combination of low-interface state density $D_{it}$ (approximately $5 \times 10^{10}$ cm$^{-2}$ eV$^{-1}$) and relatively high positive charge density ($5–10 \times 10^{11}$ cm$^{-2}$) in the PECVD oxide. Some degradation in the effective lifetime was observed in the thin PECVD oxides, but the PECVD SiN layer cap was found to be very effective in preventing this degradation and enhancing $T_{eff}$. The annealing studies showed that the forming gas ambient is superior to nitrogen, and that the RTA is better than the conventional furnace anneal for achieved low interface recombination velocity S and high effective lifetime.

EXPERIMENT VII

In addition to passivating surface defects, as described previously with respect to Experiments I–VI, bulk defects in the internal region of the silicon substrate 17 can be passivated at low temperature to achieve both low interface state density and low surface recombination velocity S within the internal region of the silicon. The bulk defects which can be passivated include vacancies, grain boundaries, and dislocations, which terms are well known in the art. Thus, if desired, lower cost substandard silicon having numerous defects could be utilized and could be processed in accordance with the present invention to transform the substandard silicon to a much higher quality material having few defects.

Figure 8:
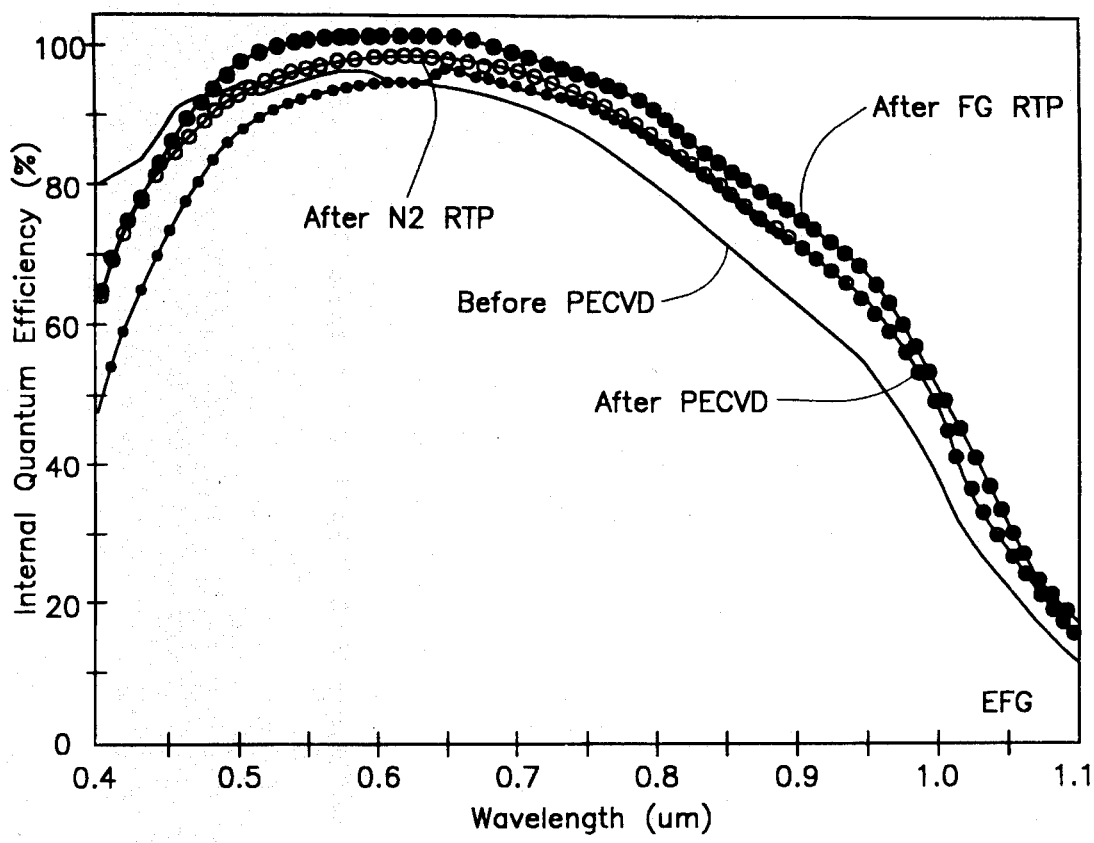
FIG. 8 is a graph of bulk passivation (internal quantum efficiency versus wavelength) of the silicon sample during RTP when a hydrogen source is present in the forming gas.

In order to demonstrate the bulk defect passivation effect due to the present invention, internal quantum efficiency (IQE) was measured on solar cells. The cells were made on low-cost p-type Edge-defined Film-fed Growth (EFG) sheet silicon material. The cells were simple $n^+pp^+$ structure, in which $n^+$ was formed by phosphorous diffusion on front surface, and $p^+$ was formed by Al diffusion on back surface of wafers. Thin layer PECVD $SiO_2$(10 nm, n=1.45) was deposited on the front surface. Then PECVD SiN(59 nm, n=2.27), and $SiO_2$(95 nm, n=1.45) were deposited on the top of the thin $SiO_2$ layer, respectively. The thin $SiO_2$(10 nm) coupled with SiN(59 nm) was used as passivation, and $SiO_2$(95 nm) was used for antireflection. After PECVD depositions, the solar cells were photo-assisted annealed in a lamp-heated rapid thermal process (RTP) system at 350° C. in forming gas or in nitrogen ambient for 20 min. The IQE measurements were conducted by Optronic 764-428 system. A typical IQE of these EFG solar cells is shown in FIG. 8. The IQE was measured before the PECVD deposition, after PECVD deposition, after $N_2$ anneal ($N_2$RTP), and after forming gas anneal (FG RTP). The improvement of IQE in short wavelength (<700 nm) due to the PECVD deposition and RTP anneal shows the surface passivation effect, while the increase of IQE in long wavelength (>800 nm) represents the bulk defect passivation effect due to the PECVD coating and photo-assisted anneal.

FIG. 8 is a graph of bulk passivation (internal quantum efficiency versus wavelength) of the silicon sample during RTP when a hydrogen source is present in the forming gas. This graph shows that defects are tied up in the bulk of the silicon. It is believed that during RTP, hydrogen ion $H^+$ migrate into the upper surface of the $SiO_x$ layer and then into the bulk of the silicon to the defects, thereby passivating the defects.

It will be obvious to those skilled in the art that many modifications and variations may be made to the experiments and embodiments described above without substantially departing from the principles of the present invention. It is intended that all such modifications and variations be included herein within the scope of the present invention, as set forth in the following claims.

Wherefore, the following is claimed:

1. A method for passivating a surface of crystalline silicon, comprising the steps of:
    forming an oxide layer over said crystalline silicon using a plasma enhanced chemical vapor deposition process; and
    lowering an interface state density associated with said silicon by heating said oxide layer and said silicon with a light radiating source after said plasma enhanced chemical vapor deposition process.

2. The method of claim 1, wherein said silicon is n-type silicon.

3. The method of claim 1, wherein said silicon is p-type silicon.

4. The method of claim 1, wherein said oxide layer is formed below about 250 degrees Celsius.

5. The method of claim 1, wherein said heating step is performed at between 300° and 450° C.

6. The method of claim 1, wherein said heating step includes the step of utilizing a forming gas having hydrogen so that hydrogen migrates to and passivates defects within said silicon.

7. The method of claim 1, further comprising the step of forming a nitride layer over said oxide layer.

8. The method of claim 1, wherein said plasma enhanced chemical vapor deposition process uses a plasma containing silane ($SiH_4$) and nitrous oxide ($N_2O$).

9. The method of claim 1, further comprising the step of forming an aluminum layer over said oxide layer.

10. The method of claim 1, further comprising the step of producing an integrated circuit.

11. The method of claim 6, wherein said forming gas comprises about 90 percent nitrogen gas and 10 percent hydrogen gas.

12. A method for passivating surface and bulk defects in crystalline silicon, comprising the steps of:
    forming an oxide passivating layer over said crystalline silicon using a plasma enhanced chemical vapor deposition process;
    lowering an interface state density associated with said silicon by heating said passivating layer and said silicon with a light radiating source after said plasma enhanced chemical vapor deposition process; and
    exposing said passivating layer to a hydrogen-containing forming gas while said passivating layer is being heated so that hydrogen migrates to and passivates said surface and bulk defects within said silicon.

13. The method of claim 12, wherein said defects comprise dislocations.

14. The method of claim 12, wherein said defects comprise grain boundaries.

15. The method of claim 12, wherein said defects comprise vacancies.

16. The method of claim 12, wherein said silicon is n-type silicon.

17. The method of claim 12, wherein said silicon is p-type silicon.

18. The method of claim 12, wherein said passivating layer is formed below about 250 degrees Celsius.

19. The method of claim 12, wherein said heating step is performed at about 350 degrees Celsius.

20. The method of claim 12, wherein said plasma enhanced chemical vapor deposition process employs an electromagnetic plasma excitation signal having a frequency of about 13.7 megahertz.

21. The method of claim 12, wherein said plasma enhanced chemical vapor deposition process uses a plasma containing silane ($SiH_4$) and ammonia ($NH_3$) to produce atomic hydrogen during film deposition.

22. The method of claim 12, wherein said plasma enhanced chemical vapor deposition process uses a plasma containing silane ($SiH_4$) and nitrous oxide ($N_2O$) for producing atomic hydrogen to passivate defects.

23. The method of claim 12, further comprising the step of producing a solar cell.

24. The method of claim 12, further comprising the step of producing an integrated circuit.

25. The method of claim 12, wherein said forming gas comprises about 90 percent nitrogen gas and 10 percent hydrogen gas.

26. A method for passivating a surface of crystalline silicon, comprising the steps of:
    forming an oxide layer over said crystalline silicon using a plasma enhanced chemical vapor deposition process; and
    heating said oxide layer and said silicon to a temperature of about 350° C. with a light radiating source after said plasma enhanced chemical vapor deposition process so that an interface state density associated with said silicon is lowered.

27. A method for passivating a surface of crystalline silicon, comprising the steps of:
    forming an oxide layer over said crystalline silicon using a plasma enhanced chemical vapor deposition process; and heating said oxide layer and said silicon to a temperature approximately between 300° and 450° C. with a light radiating source after said plasma enhanced chemical vapor deposition process so that an interface state density associated with said silicon is lowered.

28. A method for passivating a surface of crystalline silicon, comprising the steps of:

forming an oxide layer over said crystalline silicon using a plasma enhanced chemical vapor deposition process;

forming an aluminum layer over said oxide layer; and achieving an interface state density associated with said silicon at least as low as $1.1 \times 10^{10}$ cm$^{-2}$ eV$^{-1}$ by heating said oxide layer and said silicon with a light radiating source after said plasma enhanced chemical vapor deposition process.

* * * * *